United States Patent [19]

Keller et al.

[11] Patent Number: 5,196,706

[45] Date of Patent: Mar. 23, 1993

[54] EXTRACTOR AND DECELERATION LENS FOR ION BEAM DEPOSITION APPARATUS

[75] Inventors: John H. Keller, Poughkeepsie, N.Y.; James W. Robinson, State College, Pa.

[73] Assignee: International Business Machines Corporation, Armonk, N.Y.

[21] Appl. No.: 738,214

[22] Filed: Jul. 30, 1991

[51] Int. Cl.⁵ .......................................... H01V 37/147
[52] U.S. Cl. .............................. 250/396 R; 250/398; 250/492.2; 313/361.1
[58] Field of Search ............. 250/492.21, 398, 396 R, 250/492.2; 313/361.1

[56] References Cited

U.S. PATENT DOCUMENTS

| | | |
|---|---|---|
| 2,736,809 | 11/1945 | Bacon . |
| 3,304,718 | 8/1965 | Webb ................................ 60/202 |
| 3,904,505 | 9/1975 | Aisenberg ..................... 250/492.21 |
| 4,151,420 | 4/1975 | Keller et al. ........................ 148/1.5 |
| 4,179,312 | 12/1979 | Keller et al. ...................... 250/492.2 |
| 4,191,888 | 3/1980 | Meadows ....................... 250/396 R |
| 4,233,537 | 11/1980 | Limpaecher ...................... 313/231.3 |
| 4,383,177 | 5/1983 | Keller et al. ...................... 250/423 R |
| 4,409,520 | 10/1983 | Koike et al. ........................ 315/39 |
| 4,439,685 | 3/1984 | Plies ................................... 250/398 |
| 4,447,761 | 5/1984 | Stinnett ............................ 315/111 R |
| 4,447,773 | 5/1984 | Aston ................................. 328/233 |
| 4,629,930 | 12/1986 | Sakudo et al. ..................... 313/359.1 |
| 4,633,138 | 12/1986 | Tokiguchi et al. ............. 315/111.81 |
| 4,658,143 | 4/1987 | Tokiguchi et al. ............. 250/423 R |
| 4,687,938 | 8/1987 | Tamura et al. .................. 250/423 R |
| 4,713,543 | 12/1987 | Feuerbaum et al. ................ 250/398 |
| 4,782,304 | 11/1988 | Aitken ............................. 250/492.21 |
| 5,026,997 | 6/1991 | Benveniste ..................... 250/492.21 |

FOREIGN PATENT DOCUMENTS 0135366 3/1985 European Pat. Off. .
907598 10/1962 United Kingdom .

OTHER PUBLICATIONS

"IBM Technical Disclosure Bulletin"; vol. 22, No. 8A, Jan., 1980.

Primary Examiner—Jack J. Berman
Attorney, Agent, or Firm—Whitham & Marhoefer

[57] ABSTRACT

A pair of lenses for an ion beam deposition device permit the formation of an ion beam with good beam characteristics and the variation of ion energy over an extremely wide range and at high perveance. An ion extractor is provided with a shield with a shape closely corresponding to the extraction electrode aperture to avoid sputtering and the introduction of contaminants into the material deposition process at low beam energies at the extractor. A three electrode deceleration lens allows high current beams to be decelerated to an energy of 25 eV for deposition, under some conditions. The combination of lenses allows the ion energy in the beam to be changed at particular regions along the beam so that optimal energies for focussing, mass analysis and deposition can be obtained.

17 Claims, 11 Drawing Sheets

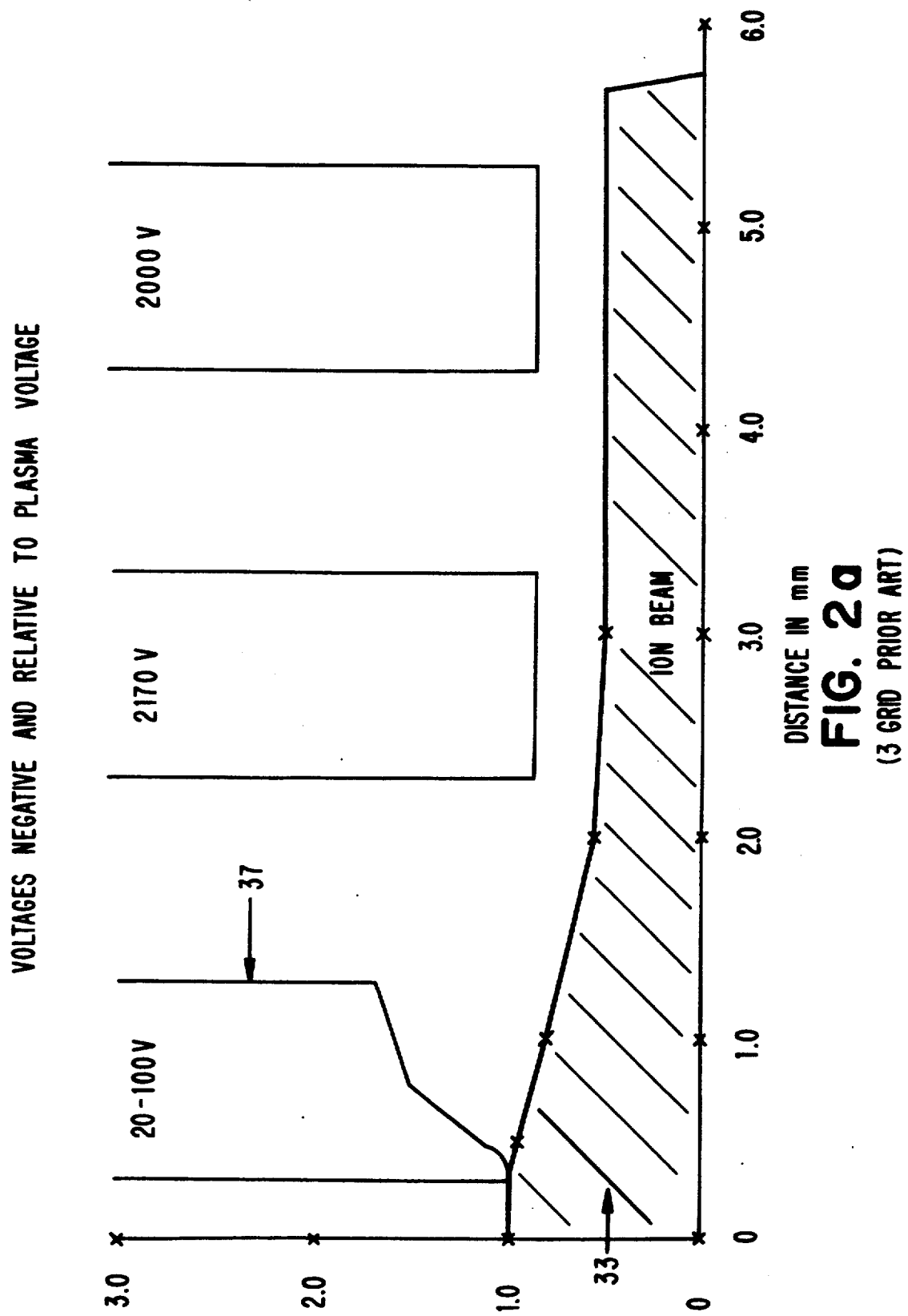

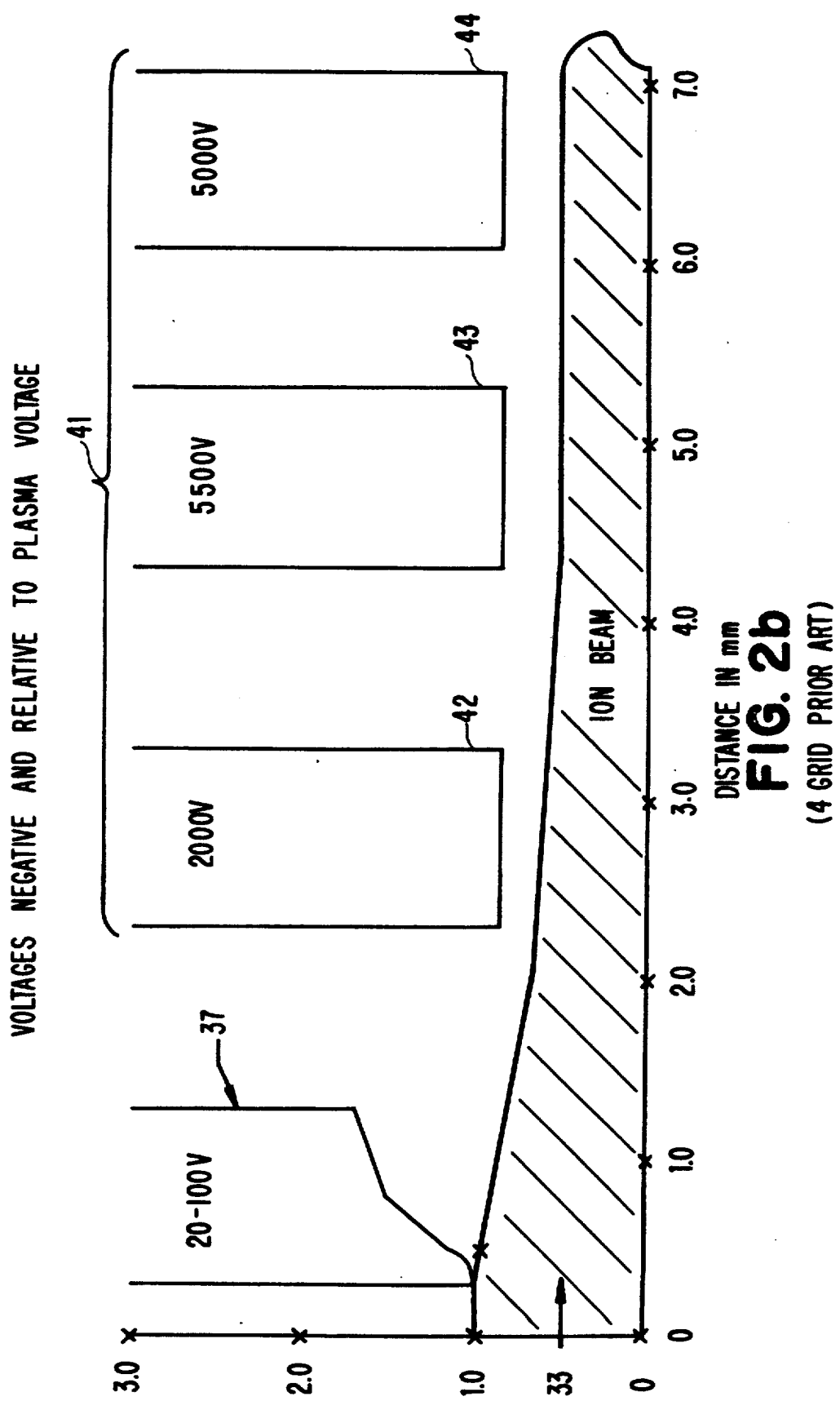

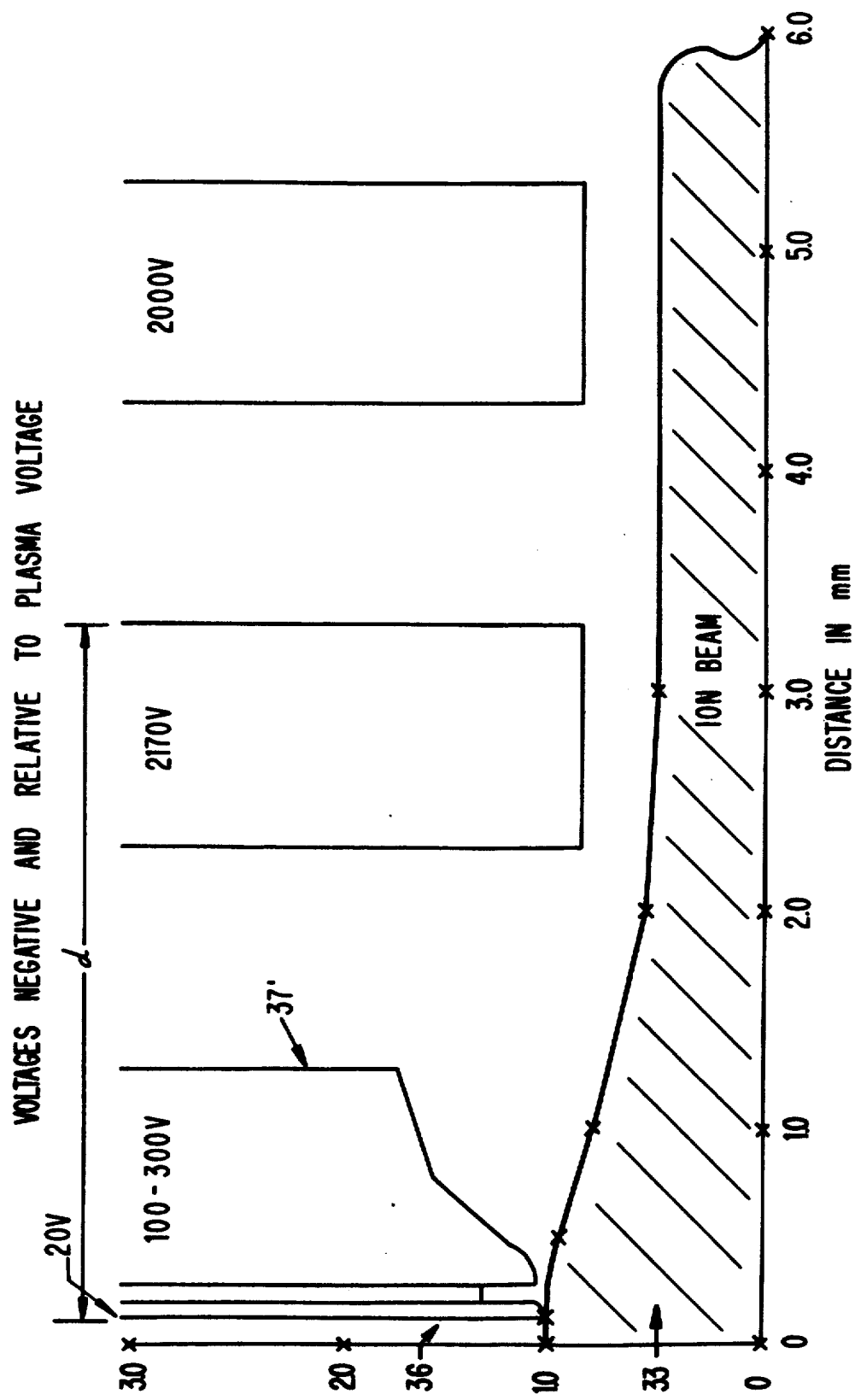

EXTRACTOR AND DECELERATION LENS FOR ION BEAM DEPOSITION APPARATUS

BACKGROUND OF THE INVENTION

1. Field of the Invention

The present invention generally relates to apparatus for producing and manipulating a charged particle beam and, more particularly, to apparatus for extracting ions from a plasma and manipulating the energy of a high-current beam of ions, so extracted.

2. Description of the Prior Art

Ion beams have been used in semiconductor manufacture for both impurity implantation and ion beam lithography for a number of years. In lithography, ion beams can provide increased resolution relative to electron beams since polymer resists can be made much more sensitive to ion exposure and exposure with a focussed beam of ions can be done with little backscatter. The use of ion beams for impurity implantation is also a common practice although implantation with a focussed beam is not yet feasible at currents which allow a practical writing speed.

Impurity implantation by means of an ion beam is desirable for a number of reasons. Perhaps most important, the beam can be mass analyzed to provide implantation of only the desired impurity material. The ion beam current and implantation energy can also be very accurately controlled to provide extremely accurate concentrations and distributions of impurities and implantation depths. Such ion implantation processes can also be carried out at low temperatures, allowing the use of low temperature masking materials.

Such implantation processes use kinetic effects and are done at high energy to implant the ions within the body of a semiconductor material. More recently, efforts have been made to use an ion beam process for purposes which require deposition on the surface of a target material, such as for welding. As can be readily understood, such a deposition process produced from an ion beam would require the energy of the ion particles to be very much lower than the energies at which implantation is performed. Such reduced energies of the ions cause some difficulties to be encountered in maintaining convergence of the ion beam due to the mutual repulsion of ions bearing a like charge. However, in such an application, the need for high beam current is not necessary because the amount of material deposited is typically small.

The formation of monocrystalline epitaxial layers of a semiconductor material, particularly with conductivity determining impurities, is often necessary in the manufacture of various types of semiconductor devices. This process is often carried out through vapor phase deposition at very high temperatures of approximately 1100° -1200° C. With a few exceptions (such as p-doped and intrinsic silicon) good quality monocrystalline deposition is difficult below 1000° C. This high temperature requirement for forming a monocrystalline epitaxial layer therefore has the drawback that, particularly if other doped structures have previously been formed, out-gassing effects and/or out-diffusion between regions may occur. In device design, compensation of such effects is often difficult or impossible and can also limit the minimum dimension of conductivity region in the device for a particular manufacturing yield since impurity out-diffusion distances can easily dominate an epitaxial layer which is thinner than about 2 microns or a region of similar lateral dimension. Such out-diffusion due to the high temperature process also results in dopant distribution being less than optimally controllable, even when ion implantation is subsequently used to add impurities to the monocrystalline epitaxial layer.

It should also be noted that ion implantation, by itself, does not completely eliminate the need for a high temperature process even though ion implantation can be carried out at low temperatures since the ion implantation process causes damage to the crystal lattice structure and annealing is often necessary to repair the damage before further processing can be carried out. Therefore, ion implantation does have the advantages of extremely high purity of implantation material and allows the use of low temperature masking materials and at least minimization of high temperature diffusion effects, although the diffusion effects can be limited only to the extent that annealing may be limited.

The use of an ion beam to provide a low temperature process for producing a monocrystalline epitaxial layer has been achieved and is disclosed in detail in U.S. Pat. Nos. 4,151,420 and 4,179,312 to Keller et al, assigned to the assignee of the present invention and hereby fully incorporated by reference. These techniques are characterized by the use of multi-aperture sources to obtain high ion beam current. Such multi-aperture sources produce a broad beam and it can be readily understood that a significant amount of ion beam current is lost at the mass analysis aperture if good separation of ion masses is to be obtained, even though condensing lenses may be used for each of the superimposed beams.

These techniques achieved a relatively high beam current at the target at reasonably low energies of about 500 eV. However, these currents were spread over a relatively large area of the target (e.g. a beam diameter of about 15 cm). Thus, a beam current of about 1 ma/cm$^2$ resulted in a rate of material deposition which limited the throughput of the process. Also, by using such a large beam diameter, the epitaxial growth process was limited to performance of the process over the entire wafer and selective epitaxial growth could not even be limited to the actual chip areas, wasting beam current directed to areas of the wafer between chips.

It has also been found, by the inventors herein, that even lower ion energies are desirable for epitaxial growth during the manufacture of a semiconductor device or other object, such as a mask or calibration grid. For instance, implantation may be performed at a typical energy of approximately 20 Kev, whereas, it has been found, by the inventors herein, that energies of 2 Kev or less are required for epitaxial growth and even lower values are desirable. While the arrangements of the above-incorporated patents achieved energies of about 0.5 KeV at the target, even faster epitaxial growth for a given beam current can be achieved at energies of 50-300 eV. It has also been found that, for several reasons discussed in more detail below, energies of about 5 KeV are desirable for good performance of mass analysis where epitaxial growth consists of a material which may contain a plurality of elements (e.g. silicon and an impurity element such as boron or arsenic, depending on the conductivity type desired) and which must be deposited simultaneously at coincident locations to assure homogeneity in the epitaxial growth. It is also necessary to maintain good beam convergence and uniformity of ion current density across the beam to assure homogeneity of the epitaxial growth. Therefore, it is seen that optimal energies for mass analysis is very much higher than optimal energies for ion deposition.

As is well understood, the current of the ion beam will be largely dependent on the extraction voltage. The extraction voltage is the voltage applied to a grid-like structure to remove ions from a plasma and to form a beam. However, this voltage also initially controls ion energies due to the acceleration of the particles which occurs during extraction. The energy of the particles, to a large extent, also controls the qualities of the beam since, at higher energies, the beam scattering due to mutual repulsion between like-charged ions will have a proportionately smaller effect.

While good beam qualities have been obtained at low extraction voltages, low voltage on the source aperture also causes a problem since the acceleration of the ions is sufficiently small that the grid itself is sputtered with the material of the plasma. This can erode the grid and introduce contaminants into the process as well as greatly reducing the useful lifetime of the grid.

In summary, in the prior art, a trade-off has existed between high beam current and beam quality as well as between ion energies and beam quality. In addition, it is difficult to achieve a desirable level of beam current and beam quality consistent with durability and good service life of the extraction grid. Therefore, the prior art does not provide an arrangement which will produce a high-current ion beam with good convergence properties which can be efficiently mass analyzed and still yield a very low particle energy at the target for efficient material deposition.

SUMMARY OF THE INVENTION

It is therefore an object of the present invention to provide an ion beam system suitable for producing monocrystalline epitaxial growth of a material having an acceleration lens (e.g. ion extractor) and a deceleration lens which will allow ion energies to be simultaneously optimized for extraction, mass analysis and deposition.

It is another object of the present invention to provide an acceleration/deceleration lens arrangement which provides a high-current, low energy ion beam.

It is a further object of the invention to provide an acceleration/deceleration lens system in which the beam pattern at the exit of the lens system is similar to the beam pattern at the entry to the lens system.

It is yet another object of the invention to provide an extractor which can provide an ion beam over a range of energies including very low energy values while having a good useful lifetime and a deceleration lens which can decelerate an ion beam over a range of energy values which includes optimal values for mass analysis and deposition.

In order to achieve the above and other objects of the invention, an ion beam material deposition apparatus is provided including an extractor including a first extraction electrode having an aperture of predetermined dimensions and a shield positioned between said first extraction electrode and a plasma, said shield having an aperture substantially congruent with said aperture of said first extraction electrode, and a deceleration lens including an aperture defining an ion beam path perimeter of an ion beam at said deceleration lens, means for forming a meniscus lens substantially larger than said ion beam path perimeter to reduce aberration of said meniscus lens of said ion beam within said ion beam path perimeter.

In accordance with another aspect of the invention, an extractor is provided including a first extraction electrode having an aperture of predetermined dimensions and a shield positioned between said extraction electrode and an ion source said shield having an aperture substantially congruent with said aperture of said extraction electrode.

In accordance with a further aspect of the invention, a deceleration lens is provided including an aperture defining an ion beam path perimeter of an ion beam at said deceleration lens, a first electrode means recessed from said ion beam path perimeter, a second electrode means for simultaneously stripping electrons from said ion beam and forming a meniscus lens with said first electrode means between said first electrode means and said second electrode means to converge said ion beam by a predetermined amount, and a third electrode means for decelerating said ion beam, wherein said predetermined amount of convergence of said ion beam approximately compensates for spreading of said ion beam during deceleration.

In accordance with another further aspect of the invention, a method of decelerating an ion beam is provided including the step of converging said ion beam prior to decelerating said ion beam to approximately compensate for divergence of said ion beam during deceleration of said ion beam.

In accordance with a yet further aspect of the invention a method of extracting an ion beam from a plasma is provided including the steps of applying a relatively low potential to an apertured extraction electrode and shielding a major portion of said extraction electrode from sputtering of material from said ion source.

BRIEF DESCRIPTION OF THE DRAWINGS

The foregoing and other objects, aspects and advantages will be better understood from the following detailed description of a preferred embodiment of the invention with reference to the drawings, in which:

FIGS. 2a and 2b are diagrams of prior art three-grid and four grid extractors, respectively, FIGS. 3a and 3b are diagrams of three-grid and four grid extractors, respectively, according to the invention.

DETAILED DESCRIPTION OF A PREFERRED EMBODIMENT OF THE INVENTION

Figure 1:
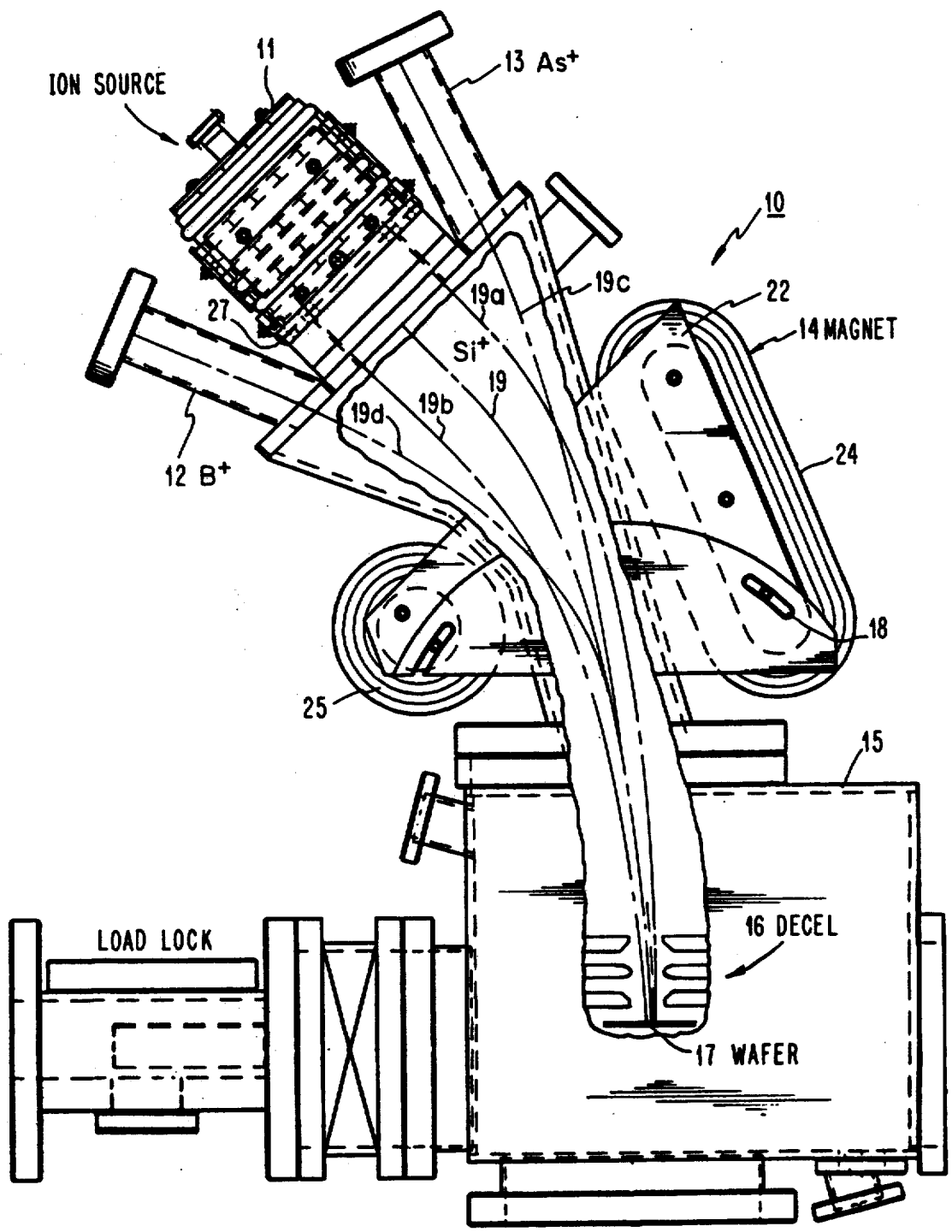
FIG. 1 is an overall view of an ion beam apparatus including the present invention.

Referring now to the drawings, and more particularly to FIG. 1, there is shown an ion beam material deposition arrangement as disclosed in application Ser. No. 07/692,589, filed Apr. 29, 1991, by John H. Keller and D. Keith Coultas, entitled LOW ENERGY, STEERED ION BEAM DEPOSITION SYSTEM HAVING HIGH CURRENT AT LOW PRESSURE, assigned to the assignee of the present invention and hereby fully incorporated by reference herein for a detailed discussion of the overall system in which the present invention may be advantageously used. The apparatus as disclosed therein has several features including steering of the ion beam from each source to achieve superposition of plural beams both in location and impingement angle, space charge neutralizing of the beam during mass analysis by confinement and enhancement of high vacuum plasma within the mass analysis magnet and an improved magnet design which provides simultaneous focussing in a radial plane simultaneously with mass analysis.

The apparatus 10 shown in FIG. 1 includes a plurality of ion sources including, for example, a silicon source 11, a boron source 12 and an arsenic source 13. To achieve a high ion beam current, the silicon source is shown as a multi-aperture source, the beams 19, 19a and 19b being converged in the radial plane of the mass analysis magnet 14 by the focussing effect of the wide raceway, the arcuate shape of pole pieces 22 and the highly uniform field over the area of the pole pieces due to the placement of coils 24, 25 on both sides of the ion beam raceway. The focal length of the focussing/mass analysis magnet is adjusted by angular positioning relative to the ion-optical axis 19, facilitated by arcuate pole piece portions and angular adjustment means 18. The target 17 is placed within an enlarged chamber 15 into which the beam is directed. During operation, the chamber 15 and the raceway are evacuated to a high vacuum. Ion extraction grids 27 are shown for ion source 11 but are omitted in FIG. 1 for sources 12 and 13 in the interest of clarity.

Referring now to FIGS. 2a and 2b, one-half of the cross-section of prior art three-grid and four grid extractors are shown in together with the approximate trajectory of the resultant ion beam. As can be readily seen, grid 37 defines the extraction aperture and, hence, the initial boundary of the ion beam. The same is true for the four-grid extractor of FIG. 2b. In forming the extraction aperture, grid 37 actually contacts not only the perimeter of the beam but forms a target for ions extracted from the plasma beyond the perimeter of the beam. It can therefore be readily understood how, in operation, grid 37 may be sputtered in a manner which changes its geometry and the geometry of the electrostatic field in its vicinity, as well as other undesirable effects, when a fairly low voltage is applied to grid 37. A beam of ions having good beam qualities can be extracted from the plasma by applying a fairly low voltage (e.g. approximately −100 volts) relative to the floating potential of the plasma to a grid positioned near an opening in plasma source. However, sputtering of the grid 37, causes erosion or clogging of the grid and the introduction of contaminants into the system. The degradation of the grid 37 under such conditions is severe and useful lifetimes for grids are limited to times on the order of ten hours or less.

Figure 3A:
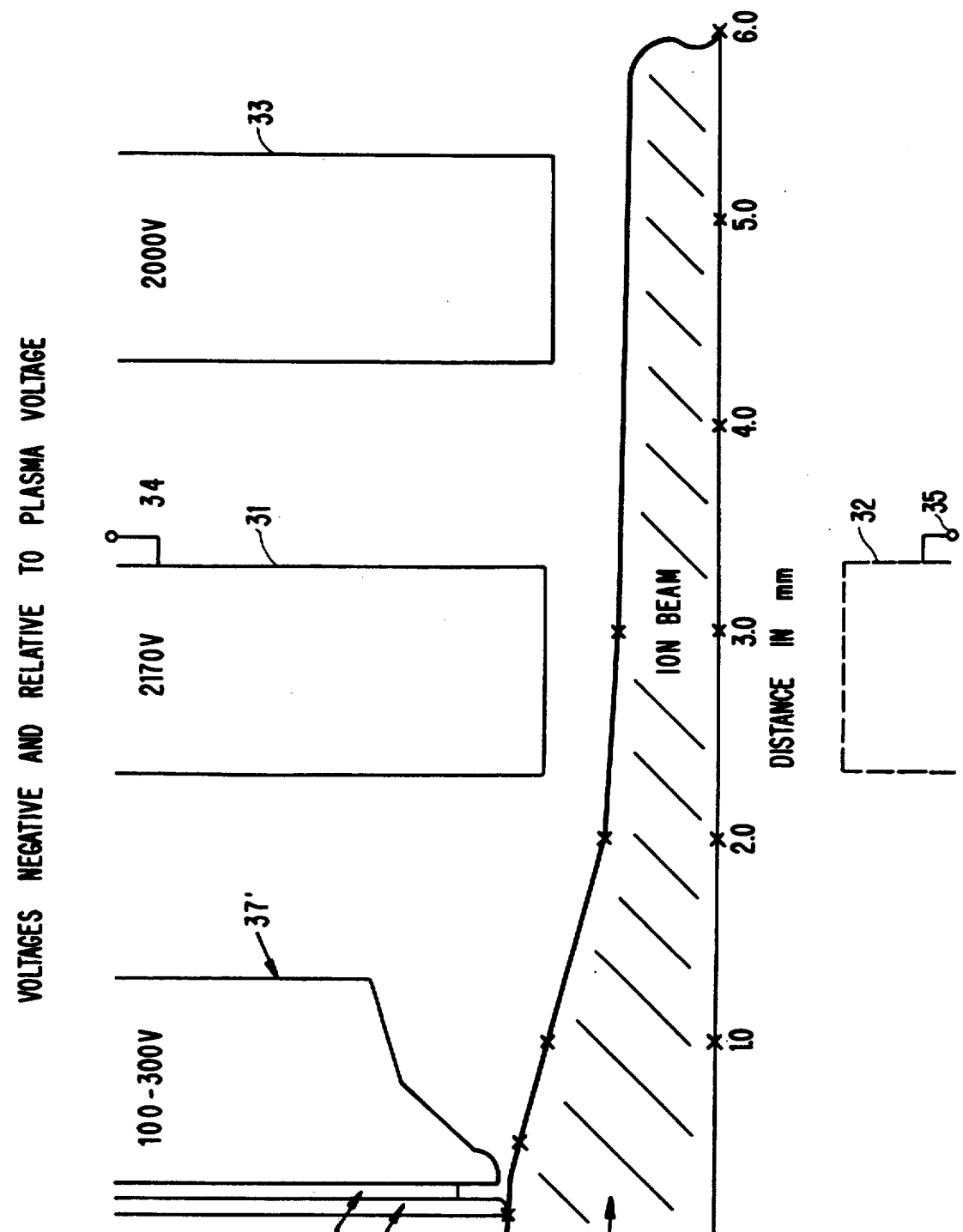

Referring now to FIG. 3a, a three-grid extractor according to the invention is shown. To prevent sputtering of the extractor grid or plate 37' and the degradation incident thereto, a shield plate 36 with a similarly shaped slit aperture is provided. The aperture in shield plate 36 should preferably be approximately congruent with the effective aperture in extractor plate 37' to cover a major portion of the extractor plate. Plate 36 may be formed of an insulator or a conductive material formed over an insulator layer 38. It is necessary to recess the insulator 38 from the ion beam path since vacuum ultraviolet radiation from the source plasma will otherwise cause surface conduction across the insulator surface between plate 36 and plate 37'. This structure with a recessed insulator 38 is preferably formed by layering insulator 38 and conductor or insulator plate 36 over a surface of electrode plate 37'. The recessing of the insulator 38 can then be accomplished by selective etching. If the material of shield plate 36 is conductive, it may be allowed to float to a potential determined by the plasma. However, this has been found to introduce noise into the system and the potential of conductor 36 is preferably held at a predetermined voltage (e.g. −20 volts) close to the floating potential of the plasma, as shown in FIG. 3b. In this way, the beam will have good beam qualities and most of the source aperture will not be sputtered, resulting in increased usable lifetime of the extractor plate or grid electrode and increased resistance to contamination during the deposition process. It should be noted that in the prior art, the first grid or electrode is sometimes referred to as the "plasma electrode" and the second electrode is sometimes referred to as an "extraction electrode". In the interest of clarity, electrode 37' of the invention will hereinafter be referred to as a "first extraction electrode".

When this technique is applied to a three grid extractor and the shield plate 36 held at a particular potential, a four grid extractor is, of course, formed. The function of the four grid extractor according to the invention as shown in FIG. 3b, compared to other four grid extractors known in the art, shown for comparison in FIG. 2b, will then be modified because of the different spacing of the extractor grids and the voltages applied thereto. Convergence of the beam will begin at the second grid of the invention rather than at the first grid as in FIG. 2b.

Specifically, in the prior art as shown in FIG. 2b, the source aperture or extractor plate 37 was usually followed by a three-electrode acceleration/deceleration lens 41. Convergence began at the extractor plate 37 and maximum convergence occurred at the acceleration aperture 43 of the center electrode of the three-electrode lens while the deceleration aperture 44 of the lens 41 caused a further divergence of the beam as well as aberration of the ion beam. According to the invention as shown in FIG. 3b, using electrode 38 having an aperture focal length equal to approximately three times the distance d, will cause convergence to begin at the second or extractor electrode. This arrangement, though more complex, has the additional advantage of reducing the aberration caused by the first aperture, yielding a more uniform ion current density profile with higher brightness over the cross-section of the ion beam.

This technique of protection of the source aperture can also be applied to the extractors having four (or more) grids. In this case, the resulting five (or more) grid extractor would differ in function from five grid extractors of the prior art in much the same way as the four grid extractor according to the invention discussed above.

From the above, it is apparent that ion extraction can be efficiently performed resulting in a beam having good qualities and with ion energies which encompass the range of energies considered optimum for both deposition and maintaining beam convergence and the performance of focussing and mass-analysis, by virtue of the extractor structure according to the invention. However, as noted above, the optimum ion energy for mass analysis and focussing is considerably higher than the optimum ion energy for deposition and, consequently, further deceleration near the deposition target 17 is desirable. While extractors functioning as acceleration/deceleration lenses are known, such lenses merely provide for extraction at a higher energy and then decelerate the ions to a desired energy. Such an arrangement is clearly not applicable to the ion optical system of the system disclosed in the above-incorporated application since an optimum ion energy should be maintained over a substantial portion of the beam path in order to provide mass-analysis and focussing and deceleration performed subsequent to mass analysis.

It should be noted that, in accordance with the above-incorporated Ser. No. 07/692,589, a split grid including portions 31 and 32 (indicated by a dashed line in FIG. 3) may be advantageously used in either of the final grids for steering of the ion beam by means of slight differences in voltage applied to terminals 4 and 35. The approximate average of the voltages applied to the grids will control the quantity of ions drawn from the plasma produced in ion source 30 and the geometry and strength of the electric field caused by the voltages on the plates of the split grid 31,32 will determine the energy of the ions in the beam. While steering of the beam is preferably done by the use of a split grid at the location shown, the split grid may also be located in the plane of electrode 33.

Figure 4:
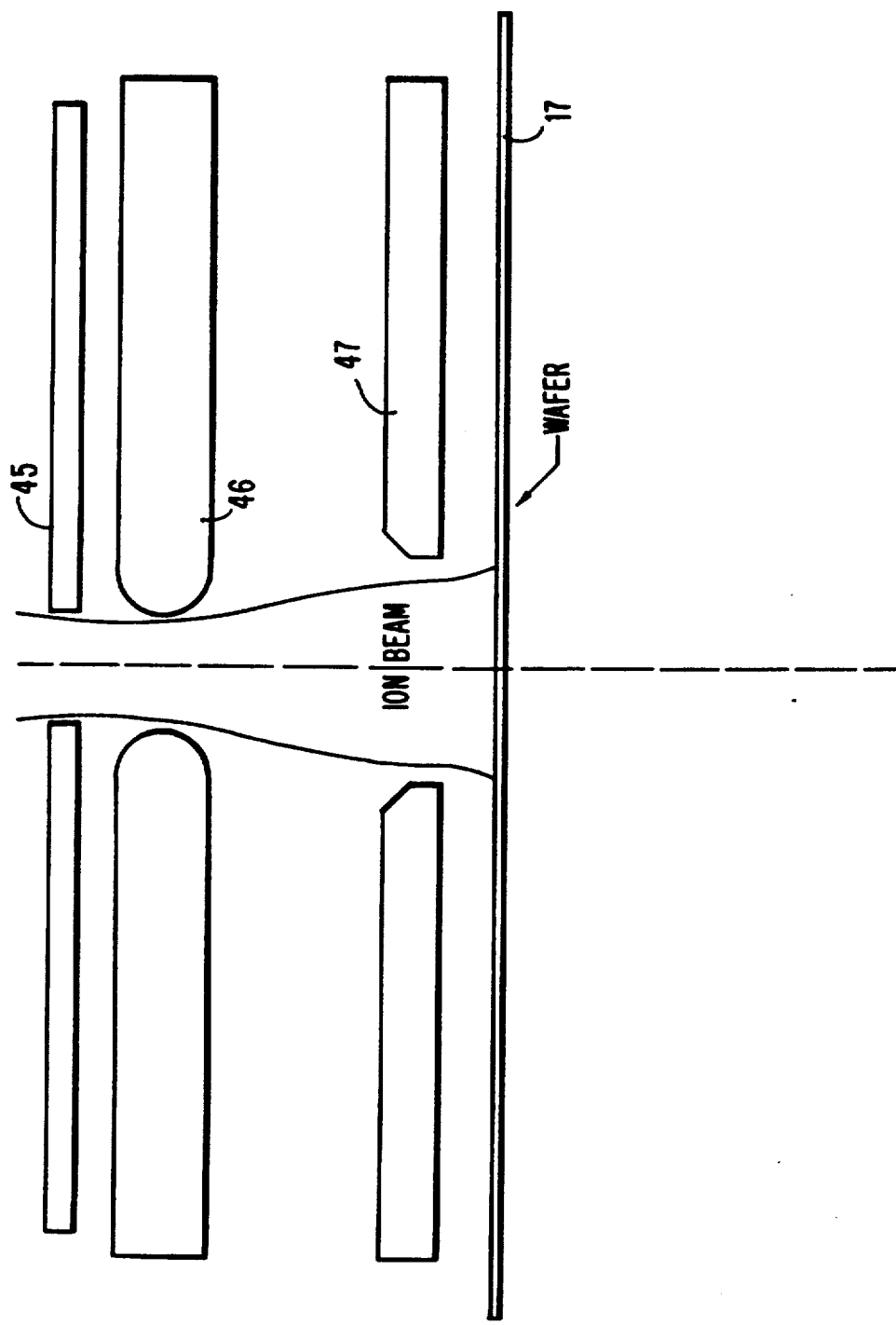
FIG. 4 is a sectional view of a prior art deceleration lens.

As taught in the above cited U.S. Pat. Nos. 4,151,420 and 4,179,312, by Keller et al., deceleration lenses have been used to decelerate the beam after mass analysis. However, in those arrangements, no focussing of the ion beam took place. FIG. 4 shows a cross-sectional view of a deceleration lens over which the present invention provides an improvement. In FIG. 4, electrode 45 forms a mass-analysis aperture and electrode 46 is held at a voltage just sufficiently negative to strip space charge neutralizing electrons from the beam. This negative potential causes a slight acceleration and convergence of the beam at electrode 46. The amount of convergence is also limited to only a few percent of the beam crosssectional dimension by the close spacing of electrodes 45 and 46 and the limitation on the potential which can be applied to electrode 46. Electrode 47 is held at a positive potential to decelerate the beam. However, as the beam is decelerated, the beam tends to spread out due to the mutual repulsion between ions of the beam since the beam is no longer space charge neutralized. Some spreading is also due to defocussing of the beam by fields within the lens. Within the lens, this spreading of the ion beam is focussed somewhat by the reduction of the field near the deceleration electrode 47 but increases rapidly between the deceleration lens and the target. The result is that the beam at the target is far (e.g. about 50%-100%) larger than the beam at the entry of the lens.

Figure 5:
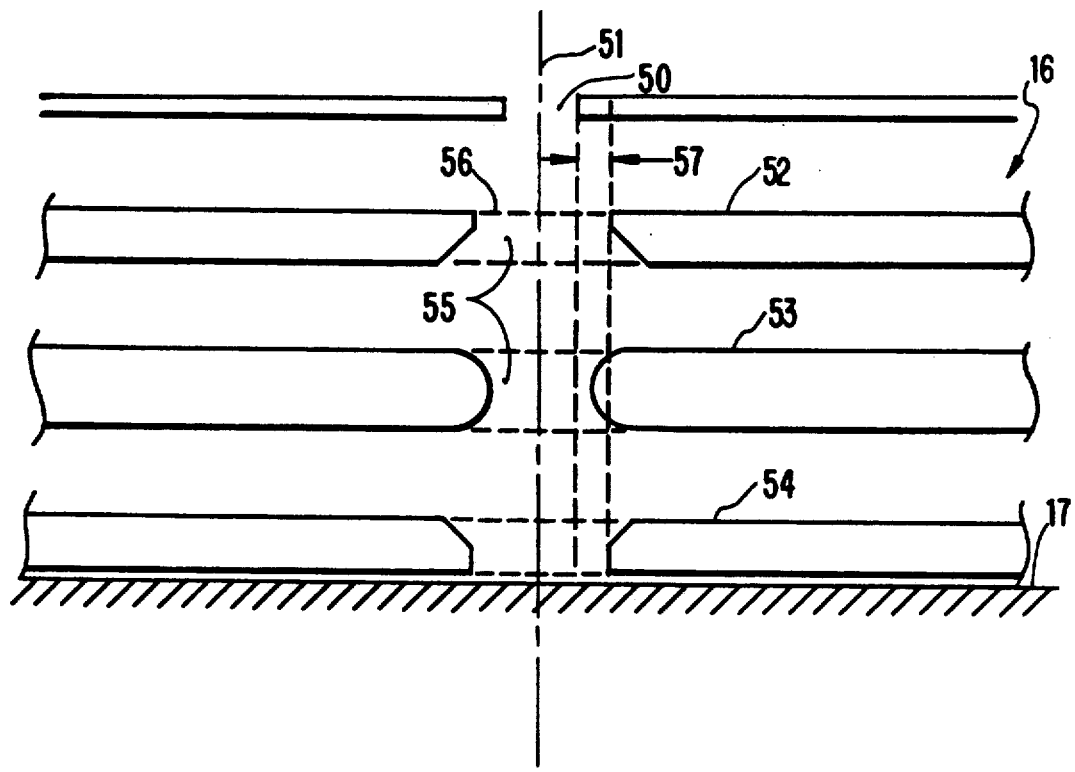
FIG. 5 is a cross-sectional view of a deceleration lens in accordance with the invention.

Referring now to FIG. 5, deceleration lens 16, according to the invention, is shown in greater detail. The view in FIG. 5 is slightly smaller than the full size of the deceleration lens simulated and described herein with regard to FIGS. 6-8 and 10-13, in which the electrode geometry is depicted in a form which is expanded in one coordinate direction in the interest of clarity. However, it should be understood that other geometries and sizes can also be used in accordance with the following description.

In use, the deceleration lens 16 is placed very close to target surface 17 since, at that point, the beam is of very low energy and would diverge rapidly due to mutual repulsion between ions and/or be deflected back into the deceleration lens. If the target surface is not close, a means must be provided for space charge neutralization after the deceleration lens. The ion beam passes through the lens generally coaxially with lens axis 51 from top to bottom in FIG. 5. The three electrodes 52-54 of this embodiment of the deceleration lens 16 were generally arranged symmetrically front-to-back of the lens although the ion trajectories will not be symmetrical since ions leave the lens at a much lower velocity and energy than that with which they enter the lens. The electrodes 52-54 themselves will each preferably be formed as a slit in a plate; portions of the plate at the ends of the slit openings 55 being typically designated by reference numeral 56 and shown by dashed lines. The shapes of the electrodes at the slit apertures shown are empirically determined by first simulating the field developed by thin planar electrodes at a given spacing and increasing the voltages applied. The equipotential curves will then provide a family of curves which will provide the same effect. Thus, shaping the electrodes to generally follow the simulated field lines and provide a fine adjustment thereof can be done very simply.

While, as indicated above, other geometries of the deceleration lens 16 could be used within the scope of the present invention, an important feature is the set back 57 of aperture boundaries (e.g. electrode tips), with respect to mass analysis aperture 50, of the front and rear electrodes 52, 54 from axis 51 which can be greater than that for main deceleration electrode 53, also preferably set back a lesser distance from aperture 50. The electrodes 52 and 54 should be recessed because strong fields will occur near the tip and cause aberrations of the ions passing close thereto. Also, as shown in FIGS. 6-8 and 10-13, the equipotential field lines will curve to form an electrostatic meniscus lens attaching to the tips of these electrodes and aberrations will be minimized if the lens is made larger by recessing these electrodes. For the same reason, the spacing between the electrodes should be as generous as possible relative to the distance to the target after space-charge neutralizing electrons are stripped away. In this regard, it should be noted that the meniscus represented by field line 62 in FIG. 8 represents the contour at which the stripping of the space charge neutralizing electrons is substantially complete in the preferred form of the invention. But for the presence of the target, a similar meniscus would exist at the rear of the lens, as well. The spherical aberration of a lens will increase with decreasing focal length and will adversely affect the uniformity of the ion density distribution across the target surface if the focal length is shortened. However, larger electrode spacings require the use of a higher center electrode potential to cause increased condensing of the beam. It should also be understood that electrodes generally of the geometry indicated above are electrostatic.

In summary, the deceleration lens according to the invention and shown in FIG. 5 differs from the prior art in several significant ways. In particular, the function and structure of electrode 45 of the prior art is separated into two electrodes 50 and 52 of the invention. By performing the mass-analysis or aperturing function with electrode 50, electrode 52 can be set back from the beam to reduce aberration of the lens. Also, the front-to-back symmetry of the lens illustrated in FIG. 5 is also desirable because such symmetry provides increased spacing between electrodes 52 and 53 in comparison with the spacing of electrodes 45 and 46 of the prior art, as shown in FIG. 4. The potential which may be applied to electrode 46 of the prior art is limited to only slightly more than the potential for stripping space charge neutralizing electrons from the ion beam since unacceptable amounts of aberration and/or breakdown between electrodes 45 and 46 will occur if higher voltages are applied. At the same time, the increased negative potential on electrode 53 allows a greater degree of convergence of the beam, on the order of 25% or more, to compensate for spreading of the beam during and subsequent to deceleration. Further, the greater deceleration can be achieved with similarly low aberration of the rear meniscus lens provided by the set back of electrode 54 from the beam path. Larger beam current can be decelerated due to the larger negative voltage on electrode 53. In addition, since the exit beam is smaller than in the prior art, the ion current density of the decelerated beam is further increased. Therefore, since greater deceleration of the beam is possible through the use of the invention, optimum deposition energies can be obtained at far higher values of perveance than in the prior art.

The above and other relationships between the electrode geometry and the applied potentials will be discussed in greater detail below. Although exact symmetry of trajectories cannot be achieved due to the decrease in ion energy during deceleration within the lens, those skilled in the art will be led to workable arrangements in view of the following discussion of the operation of the lens. Observation of trajectories in a lens with symmetrically spaced electrodes will provide the most useful explanation of the invention for this purpose.

In order to appreciate the improved performance of the invention, it should be noted that the term "normalized perveance" is a term of art which is defined as $$P = j z^2 / (\epsilon \mu v^{1.5}) \qquad (1)$$

where P is perveance, j is current density, z is a typical dimension, $\epsilon$ is permittivity of free space, $\mu$ is the square root of the charge-mass ratio of the ion and v is some characteristic potential (e.g. the impact energy). This parameter is derived by normalizing Poisson's equation as combined with equations for continuity and energy conservation. When it is considered that a measure of the current can be taken as $$i = j z^2 / (\epsilon \mu), (\text{in units of } V^{3/2}), \qquad (2)$$

it can be readily understood that perveance is a relative measure of the tendency of the beam to lose focus and expand when the electrons neutralizing the space charge of the beam are removed. It is evident that good deposition systems should have a very high perveance due to the need for high current and current density and low energy to reduce sputtering and provide a high sticking coefficient.

As background, some values of perveance for reported experimental results in recent ion deposition experiments are given in Table 1, below.

TABLE 1

| Reference | Ion | Current (μA) | Impact eV | Perveance |
|---|---|---|---|---|
| [1] | Si | 10 | 50 | 1.72 |
| [2] | Si | 5 | 100 | .30 |

TABLE 1-continued

| Reference | Ion | Current (μA) | Impact eV | Perveance |
|---|---|---|---|---|
| [3] | Pd | 3 | 10 | 11.3 |
| [4] | Pb | 10 | 24 | 14.1 |
| [5] | Mn | 250 | 100 | 21.3 |

The publications reporting the above results are given in Appendix A.

It has also been reported in the literature (reference [6], Appendix A) that a beam of space-charge neutralized Argon ions has been produced at 0.110 A and 1150 eV, which corresponds to a perveance of 205. However, this beam was space charge neutralized and of far too high an energy for material deposition, even assuming the possible application to a depositable ion. No deceleration of the beam (which could not be done without stripping the space charge neutralizing electrons) was reported. Therefore, it is seen that perveance values which have been heretofore obtained under conditions suitable for material deposition have been relatively low and higher values which have been obtained are with arrangements and materials wholly unsuited to the purpose of the present invention.

A simulation has been done by the inventors herein using the geometry of a deceleration lens 16, having a cross-section as shown in FIG. 5 but with a beam having a circular cross-section, for comparison with the values given in Table 1. The simulation used a beam diameter of 1.5 cm and a current of $i = 1.7 \times 10^5 ((V^{3/2})$ where the beam was slowed from 2 KeV to 50 eV. Substituting equation (2) into equation (1) yields (3) $P = i / v^{1.5} = 481$ for this simulation.

Although a rectangular geometry for the lens aperture, according to a preferred embodiment of the present invention, would yield somewhat different ion trajectories, the aperture width w may be treated as if it were a diameter and the parameter z becomes 0.89 w, yielding a perveance for a slotted lens of the same width as the diameter z in Equation (1) of about 80% of the perveance of this simulation. This value of perveance is still twenty times as great as beams achieved prior to the present invention under conditions suitable for material deposition and twice the highest perveance otherwise reported.

In the deceleration lens according to the present invention, the three electrodes are of a geometry and have potentials applied thereto which establish fields which converge the ion beam prior to the stripping of electrons. The initial convergence helps to compensate for the divergence effects of the saddle point and the mutual repulsion between the ions. After the electrons are stripped from the beam, the ions can be decelerated and limitation of divergence or further convergence is applied to adjust the beam width at the target and the impingement angles of the ions on the target.

The operation and function of the deceleration lens 16 and the way in which it can be made to perform its function will now be discussed with reference to FIGS. 6–8 and 10–13 which are the results of simulations under somewhat differing conditions. It is important to note that these figures represent both the electrode geometry shown in FIG. 5 and the resultant ion trajectories. These Figures show one-half of the path through the lens and the ion-optical axis of the lens lies on the horizontal axis of these Figures with the ions entering the lens from the right. It is also important to note that both axes are calibrated in centimeters and that, for purposes of clarity, the vertical axis is expanded by about a factor of four. Therefore, the angles of impingement on the target will appear greatly exaggerated and will be specifically evaluated with reference to FIG. 9. It should also be noted in FIGS. 6–8 and 10–13 that all of these simulations have an incident beam having a 1.5 cm width and an energy of 2 KeV. Each ray represents the current per centimeter of depth in a 0.025 cm thick layer to be deposited. As will be shown with regard to FIG. 7, a practical lower limit for beam energy at the target is 50 eV, used in FIGS. 6 and 7 due to angular dispersion.

Figure 6:
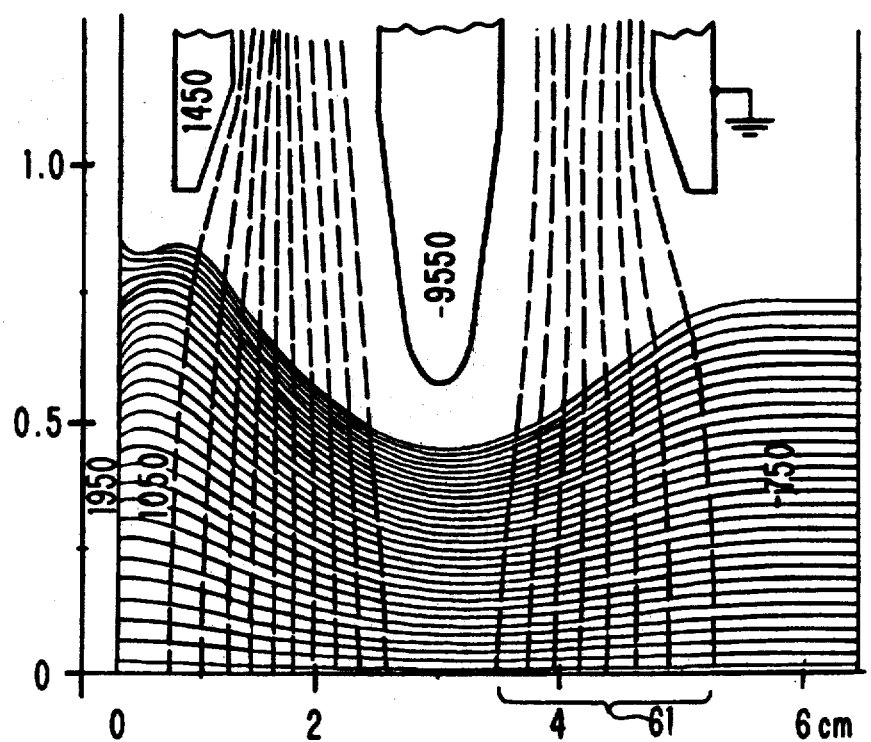
FIGS. 6, 7, 8, 10, 11, 12 and 13 are diagrams illustrating ion trajectories through the deceleration lens of FIG. 5.

Referring now to FIG. 6, the deceleration lens 15 is shown with electrode 52 at ground potential, the central electrode 53 at −9550 v and electrode 54 at a potential of +1450 v. Meniscus lenses are formed between each pair of electrodes formed by the equipotential contours, as shown. As the ions are drawn into the saddle point, the meniscus lens between electrodes 52 and 53 causes the ion beam to be accelerated and to converge, rather than diverge, as the electrons are stripped away. This convergence of the ion beam partially compensates for the later spreading of the beam but, more importantly, causes an inward angular trajectory such that the ions emerge from the lens with trajectories more or less normal to the target. It should be noted, at this point, that the convergence of the beam is a function of the meniscus lens and the stripping of the electrons is a function of the voltage applied to the center electrode 53 which causes a potential barrier to exist. In this way these functions are sufficiently separated that the trajectory angle can be adjusted through a range to provide the degree of beam convergence necessary to counteract beam divergence due to mutual repulsion between ions and to maintain a desired beam width at the exit of the lens. It should also be noted that the greater the space charge, the greater must be the converging fields and the greater the negative potential which must be applied to the central electrode 53. A certain degree of correlation between the central electrode potential and the focal length of the meniscus lens would be expected to occur but the focal length of the meniscus lens can be varied within a range sufficient to assure an appropriate output trajectory. Conversely, for a given potential of the central electrode, the potential of the saddle point will rise with increasing space charge until electrons spill over the barrier provided by the central electrode. Thus, the potential barrier can be somewhat independently increased to assure complete stripping of the space charge electrons while the ion trajectory is maintained within acceptable limits by the meniscus lens. Therefore, as a general design methodology, is desirable to determine the center electrode voltage which will be necessary to establish a saddle point potential which will assure complete stripping of electrons from the ion beam, establish a spacing between center electrode 53 and front electrode 52 which is as generous as possible (to minimize spherical aberration) at the determined voltage of the center electrode and then determine the aperture size (e.g. setback) of electrode 52 and the voltage necessary to adjust the focal length of the front meniscus lens to provide the necessary degree of beam condensing or convergence to compensate for trajectory angles at the target.

Figure 7:
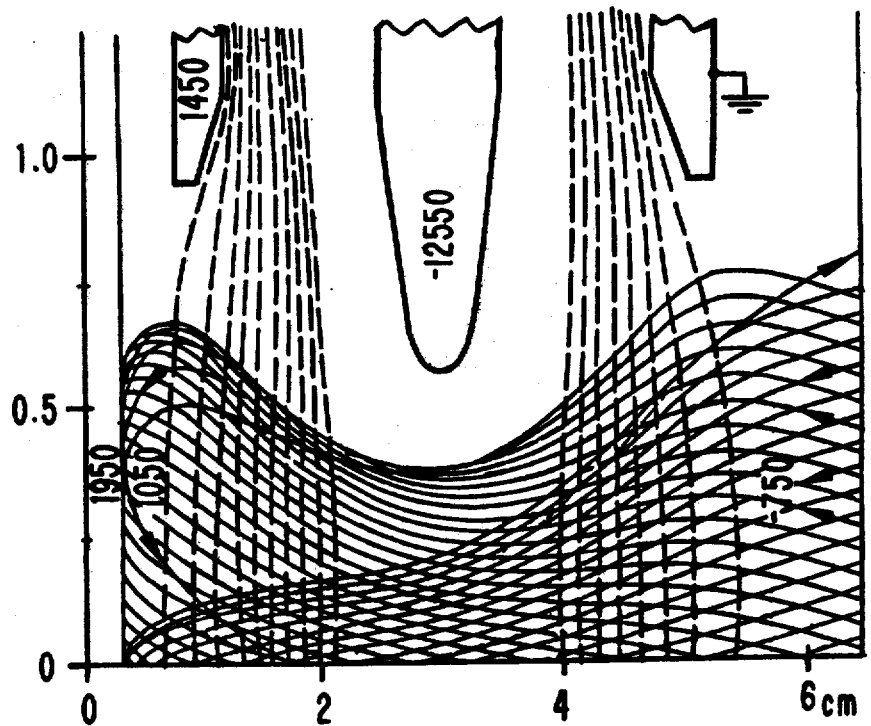
Figure 8:
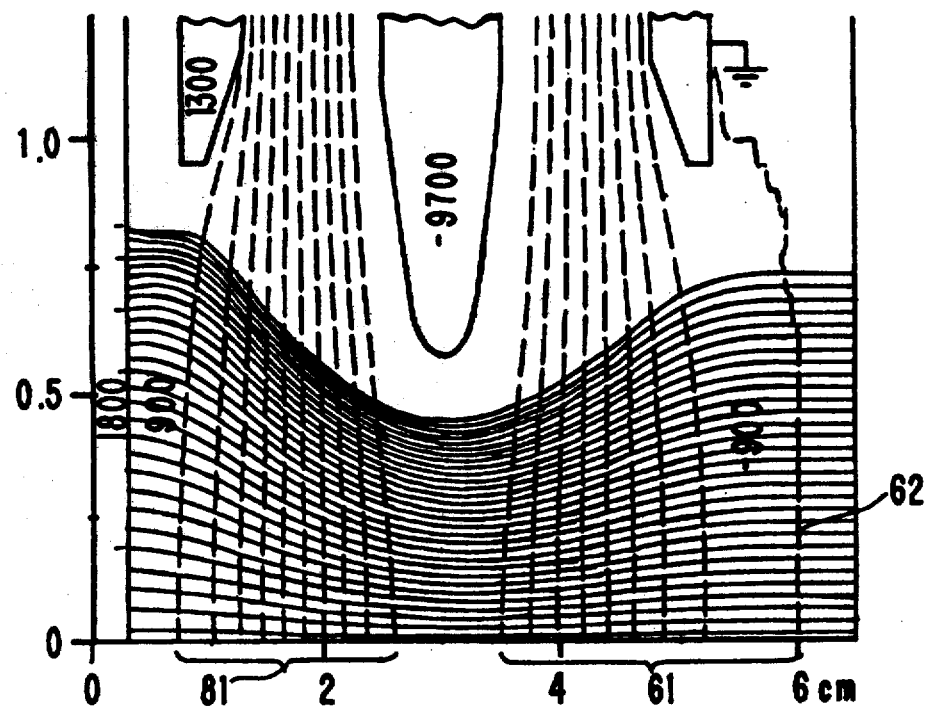

Referring now to FIG. 7, beam trajectories are shown initially entering the lens at an angle of 4° to axis 51 of the deceleration lens 16. It has been found that, using the system of FIG. 1, the beam divergence can generally be kept within this angle to axis 51 with good reliability. FIG. 7 is therefore illustrative of a limiting case where a beamlet at the periphery of the beam reaches the target at a tangent thereto and is drawn back into the lens. Therefore, for a worst case beam divergence of 4°, deceleration to 50 eV is a practical limit for operation of the invention although even lower energies might be obtained for smaller beam divergences and/or closer locations of the target. For instance, with the target spacing shown, simulations have been successfully accomplished to energies of 25 eV for parallel beamlets. In any event, energies in this range are much lower than could be accomplished in the prior art and are well within a range of energies where material deposition can be accomplished at high efficiency.

Figure 9:
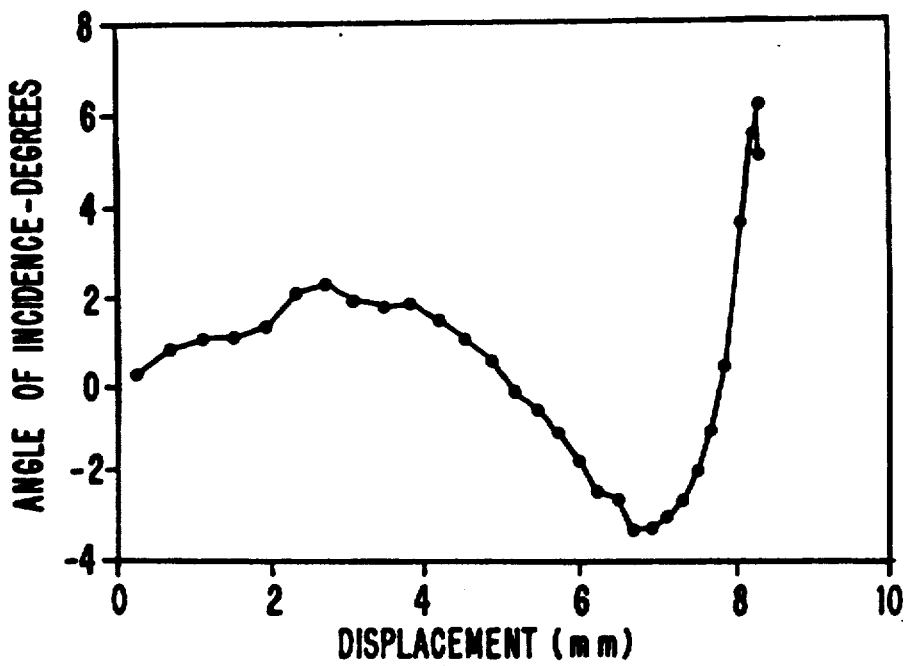
FIG. 9 is a graph useful in understanding an aspect of the invention illustrated in FIG. 8.

FIGS. 8 and 10–13 all show beam trajectories where ions are decelerated to 200 eV, rather than 50 eV. FIG. 8 is comparable in current density to FIG. 6 and the voltages applied to the central electrode is similar. In this case, it is seen that the amount of beam divergence after exit from the lens is substantially less than the case for deceleration to 50 eV and the angle of incidence at the target is reduced. Although the angles of incidence are exaggerated in FIG. 8, due to the expansion of the vertical axis, the actual angles are quite small, as shown in FIG. 9, where the actual angle of incidence is plotted as a function of displacement from axis 51 as the ion beamlet enters the lens. The angle of incidence at the target is kept within ±2° for displacements of less than about 6 mm (a beam width of 1.2 cm) and is kept within reasonable bounds (−4° to +6°) for the full 1.5 cm beam width specified in the simulation. Again, much of the angular deviation at the fringes of the beam is caused by mutual repulsion of the ions after exit from the deceleration lens.

Figure 10:
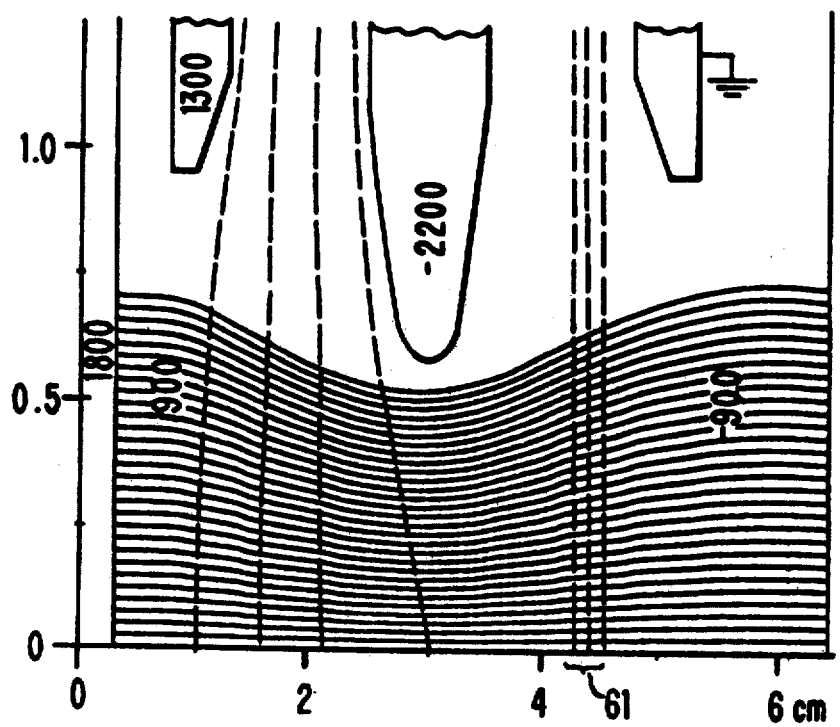

FIG. 10 shows the case where there is little space charge and the center electrode voltage can, correspondingly be low. Note, however, that although the front meniscus lens 61 is relatively weak, and its focal length relatively long, sufficient beam convergence is provided to prevent the ion beamlets at the periphery of the beam from striking the center electrode. This focussing must be provided even where there is no net deceleration performed by the lens.

It should also be noted from a comparison of the beamlet spacing at the target of FIGS. 6, 8 and 10, that the aberrations will be reduced. It should be further noted that the size of the exit ion pattern is virtually identical to the ion density distribution at the entrance to the lens. Therefore, in the preferred embodiment where the deceleration lens is used in combination with the material deposition apparatus of FIG. 1, particularly when plasma confinement within the mass-analysis magnet is provided, the invention provides improvement of the pattern of the ion beam at the target, the intensity distribution within the pattern and limitation of differences of angle of impingement on the target. Because of the plasma containment, the space charge neutralization will be attenuated and the negative potential on electrode 53 may be reduced which has the beneficial effect of allowing the use of lower center electrode voltages to obtain greater freedom from aberrations. However, if the dispersion angle is to remain within the limits shown in FIG. 9, the deceleration lens must be located close to the region in which the beam is substantially space charge neutralized which is, in practice, after the focussing magnet and preferably at the waist of the beam. If the beam is not space charge neutralized, the beam expands and the current density at mass-analysis aperture 50 is greatly reduced.

From the above, it is seen that the invention can be used at any current from negligible levels to $3.5 \times 10^5$ amperes, normalized by $\epsilon\mu$ in MKS units, as defined above, where the impact energy is 200 eV and, at a current of $1.7 \times 10^5$ normalized amperes, can decelerate ions from 2 KeV to any desired energy between 50 eV and 2 KeV. Deceleration to 25 eV can be done under more stringent dispersion constraints.

Figure 11:
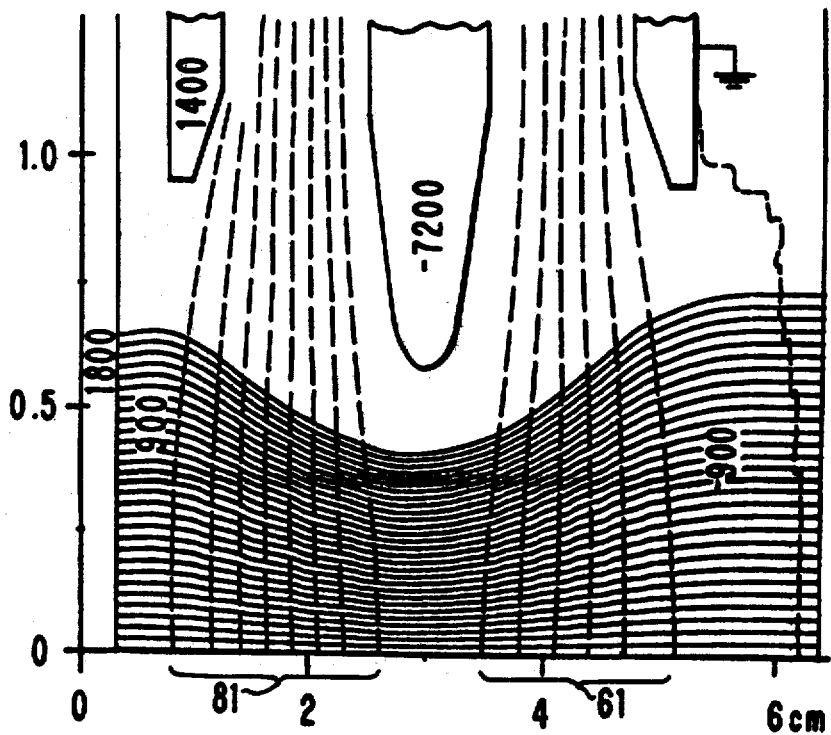
Figure 12:
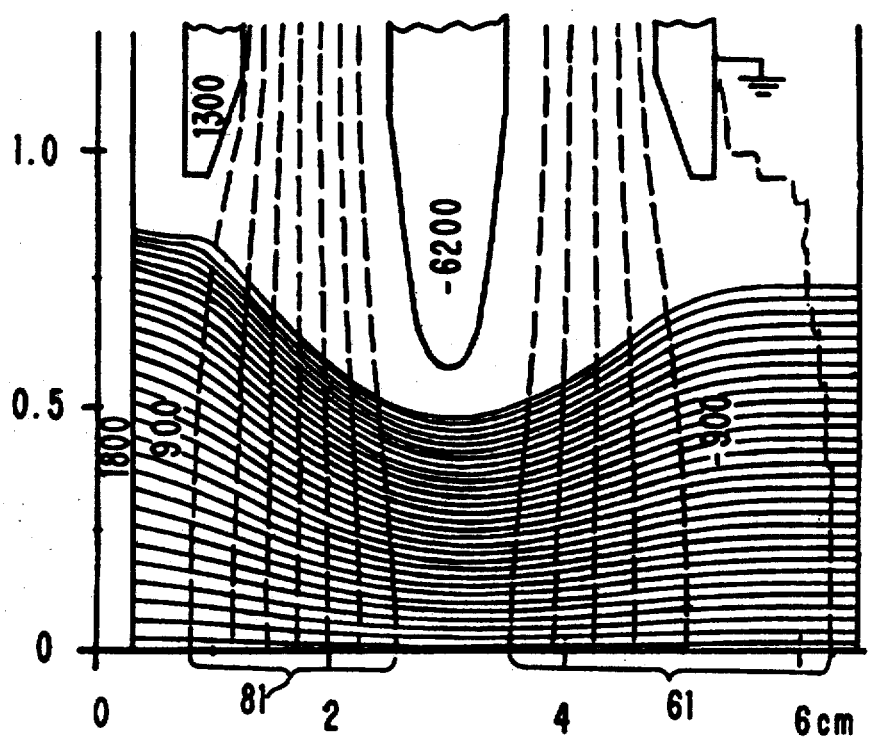
Figure 13:
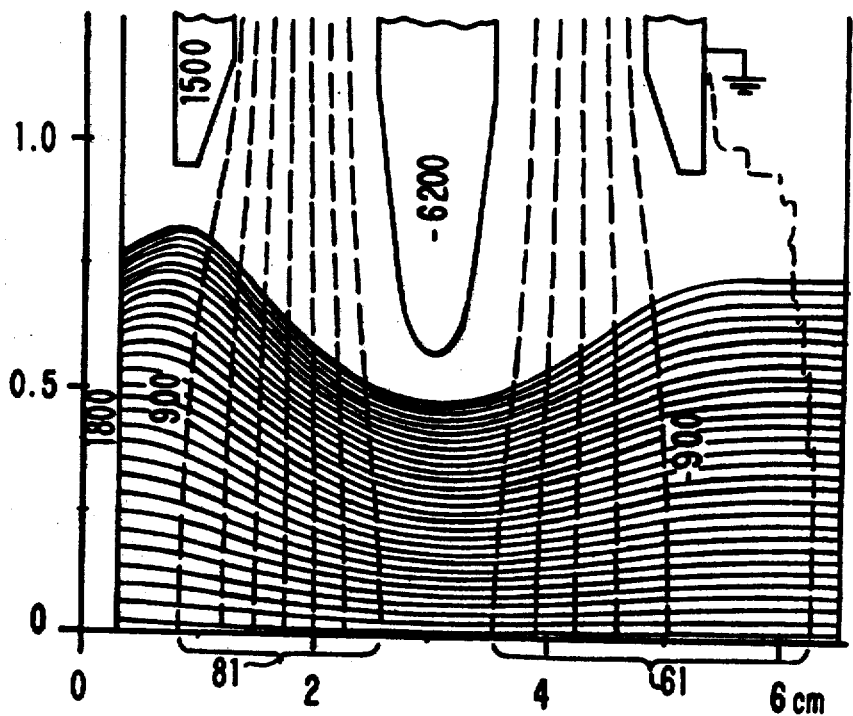

Referring now to FIGS. 11-13, The operation of the rear meniscus lens will now be explained. As pointed out above, during the convergence of the ion beam and the stripping of electrons from the beam, the ions are also accelerated. The deceleration function, therefore, occurs between the planes of the central electrode, the rear electrode and the target surface. Between the planes of the center electrode 53 and rear electrode 54, the ions are both attracted by the center electrode and repelled by the rear electrode. The repulsion between the ions and the rear electrode also causes a converging effect of the ion beam due to the curvature of the equipotential lines of the rear meniscus lens. It should also be noted that the rear electrode is provided with a voltage which is more positive than that provided to the front electrode. Consequently, the electrostatic field is greater and the focal length of the meniscus lens somewhat shorter than at the front meniscus lens, as indicated by the relative number of equipotential lines depicted in each of FIG. 6-8 and 10-13.

Comparing FIGS. 11 and 12, the reduction of voltage on the center electrode 53 allows the beam to expand due to the reduced focal length of the front meniscus lens 61. An adjustment of the voltage placed on rear electrode 54 must also be made to maintain an impact angle which is nearly perpendicular to the target. Since the focal length of the rear meniscus lens is also increased by the reduction of the electrostatic field between the rear electrode and the center electrode, the converging effect of the rear meniscus lens is also reduced and the impact area of the beam is substantially increased. Comparing FIG. 12 to FIG. 13, it is seen that an opposite change in correction of the voltage at the rear electrode causes the converging effect to be increased but that the impact area remains larger than in FIG. 11 and the impact angles depart dramatically from the perpendicular to the target, causing them to tilt downwardly, particularly in the vicinity of the rear electrode 54. Therefore, it is seen that the central electrode voltage is much more effective than the rear electrode voltage in the determination of pattern width at the target, particularly in view of the large changes in ion trajectory which occur with changes in the rear electrode potential.

Figure 14:
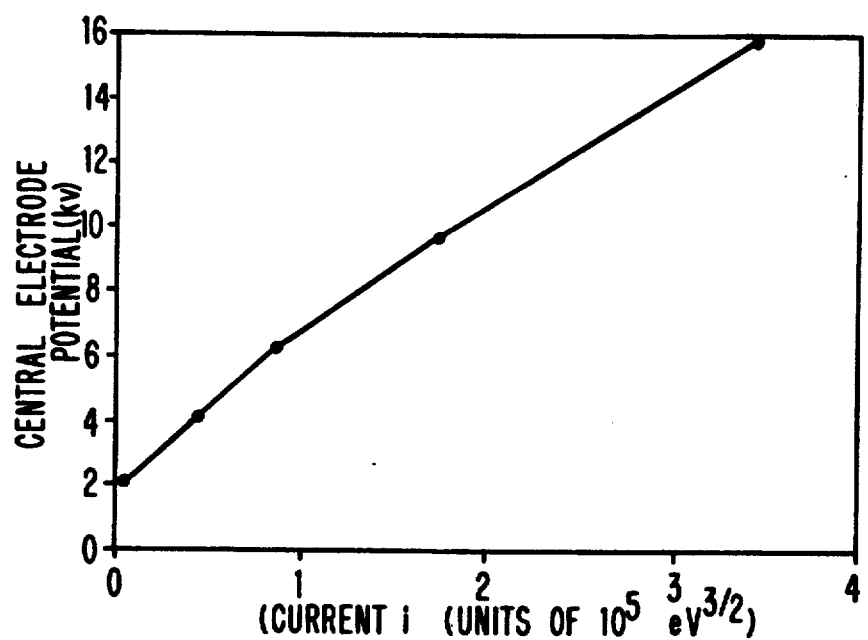
FIG. 14 is a graph useful in showing the relationship between beam current and the potential which should be applied to the central electrode of the deceleration lens, in accordance with the invention.

As shown in FIG. 14, for a predetermined pattern width on the target, the required voltage on the central electrode increases with ion beam current. Therefore, by adjusting the central electrode potential and trimming the rear electrode voltage, a wide range of beam currents may be accommodated.

In view of the above, it is seen that an acceleration/deceleration lens system has been provided by means of which ion energies may be accurately controlled, consistent with efficient operation of a material deposition system, over a wide range of values including values which may be found to be optimum for both a focussing/mass analysis function and a deposition function, independently and over the entire length of the ion optical column of the deposition apparatus. Particularly when used in combination with the apparatus of FIG. 1, the invention is clearly capable of producing an ion beam having perveance value far above those obtainable in the prior art and which are thus far better suited to material deposition properties than have been heretofore attained.

While the invention has been described in terms of a single preferred embodiment, those skilled in the art will recognize that the invention can be practiced with modification within the spirit and scope of the appended claims.

APPENDIX A

[1] Zalm et al., Appl. Phys. Lett., 41,167 (1982)

[2] Kunihiro et al., Japanese Appl. Phys. Lett., 16, 245 (1977)

[3] Yamada et al., Nuc. Instrum. Meth. in Phys. Res., B6, 439 (1985)

[4] Amano et al., J. Vac. Sci. Technol. 13, 591 (1976)

[5] Freeman et al., Nuc. Instrum. Meth., 135, 1 (1976)

[6] Zhang et al., Nuc. Instrum. Meth. in Phys. Res., B6, 447 (1985)

Having thus described my invention, what I claim as new and desire to secure by Letters Patent is as follows:

1. An ion beam apparatus including
   an extractor including a first extraction electrode having an aperture of predetermined dimensions and a shield positioned between said first extraction electrode and a plasma, said shield having an aperture substantially congruent with said aperture of said first extraction electrode, and
   a deceleration lens including
   an aperture defining an ion beam path perimeter of an ion beam at said deceleration lens,
   means for forming a meniscus lens substantially larger than said ion beam path perimeter to reduce aberration of said meniscus lens of said ion beam within said ion beam path perimeter.

2. An ion beam apparatus as recited in claim 1, wherein said shield means is an insulator.

3. An ion beam apparatus as recited in claim 1, wherein said shield means is a conductor held at a potential approximately equal to a floating potential of a plasma within said ion source.

4. An ion beam apparatus as recited in claim 1, wherein said means for forming a meniscus lens includes
   a first electrode means recessed from said ion beam path perimeter, and
   a second electrode means forming a meniscus lens with said first electrode means by curvature of equipotential lines between said first electrode means and said second electrode means.

5. An ion beam apparatus as recited in claim 4, wherein said second electrode means includes an electrode recessed from said ion beam path perimeter by a smaller distance than said recess of said first electrode means.

6. An ion beam apparatus as recited in claim 4, wherein said deceleration lens further includes a third electrode means for decelerating said ion beam.

7. An ion beam apparatus as recited in claim 6, wherein said third electrode means is located with approximate symmetry to said first electrode means with respect to said second electrode means.

8. An ion beam apparatus as recited in claim 6, wherein said first and third electrode means each have an aperture larger and recessed further from an ion optical axis of said deceleration lens than an aperture in said second electrode means.

9. A deceleration lens for an ion beam apparatus, said deceleration lens including
   an aperture defining an ion beam path perimeter of an ion beam at said deceleration lens,
   a first electrode means recessed from said ion beam path perimeter,
   a second electrode means for simultaneously stripping electrons from said ion beam and forming a meniscus lens with said first electrode means by curvature of equipotential line between said first electrode means and said second electrode means to converge said ion beam by a predetermined amount, and
   a third electrode means for decelerating said ion beam,
   wherein said predetermined amount of convergence of said ion beam approximately compensates for spreading of said ion beam during deceleration.

10. A deceleration lens for an ion beam apparatus, said deceleration lens including
    an aperture defining an ion beam path perimeter of an ion beam at said deceleration lens,
    a first electrode means recessed from said ion beam path perimeter, and
    a second electrode means forming a meniscus lens with a potential of said first electrode means between said first electrode means and said second electrode means,
    whereby said recess of said first electrode reduces aberration of said meniscus lens of said ion beam within said ion beam path perimeter.

11. A deceleration lens for an ion beam apparatus, said deceleration lens including
    an aperture defining an ion beam path perimeter of an ion beam at said deceleration lens,
    a first electrode means recessed from said ion beam path perimeter,
    a second electrode means for simultaneously stripping electrons from said ion beam and forming a meniscus lens with said first electrode means by curvature of equipotential line between said first electrode means and said second electrode means to converge said ion beam by more than 25%.

12. A method of decelerating an ion beam including the step of converging said ion beam prior to decelerating said ion beam to approximately compensate for divergence of said ion beam during deceleration of said ion beam.

13. A method of decelerating an ion beam as recited in claim 12, including the further step of converging said ion beam, at least in part, subsequently to deceleration of said ion beam.

14. An extractor for an ion beam apparatus including a first extraction electrode having an aperture of predetermined dimensions and a shield means for shielding said first extraction electrode from sputtering positioned adjacent said first extraction electrode and between said first extraction electrode and a plasma, said shield means having an aperture substantially congruent with said aperture of said first extraction electrode.

15. An extractor for an ion beam apparatus as recited in claim 14, wherein said shield means is an insulator.

16. An extractor for an ion beam apparatus as recited in claim 14, wherein said shield means is a conductor held at a potential approximately equal to a floating potential of a plasma within said ion source.

17. A method of extracting an ion beam from a plasma including the steps of
    applying a relatively low potential to an apertured first extraction electrode, and
    shielding a major portion of said extraction electrode from sputtering of material from said ion source using an apertured plate.

* * * * *